(12) United States Patent
Makiej

(10) Patent No.: US 11,470,733 B2
(45) Date of Patent: Oct. 11, 2022

(54) HOUSING WITH PRESSURE EQUALIZATION

(71) Applicant: Continental Automotive Systems Inc., Auburn Hills, MI (US)

(72) Inventor: Wojciech A. Makiej, Oakland, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 400 days.

(21) Appl. No.: 16/708,624

(22) Filed: Dec. 10, 2019

(65) Prior Publication Data

US 2021/0176875 A1 Jun. 10, 2021

(51) Int. Cl.
*H05K 5/02* (2006.01)

(52) U.S. Cl.
CPC .................................. *H05K 5/0217* (2013.01)

(58) Field of Classification Search
CPC .................................................. H02K 5/0217
USPC .............. 220/721, 720, 722, 203.15, 203.16, 220/203.17, 203.18, 370, 371, 372
See application file for complete search history.

(56) References Cited

U.S. PATENT DOCUMENTS

| | | | | |
|---|---|---|---|---|
| 1,950,327 A | * | 3/1934 | Punte | B65D 51/1644 220/203.18 |
| 3,394,840 A | * | 7/1968 | Pecci | B65D 79/02 220/721 |
| 4,071,040 A | | 1/1978 | Moriarty | |
| 4,921,124 A | * | 5/1990 | Stammler | H01H 9/047 220/372 |
| 4,998,638 A | * | 3/1991 | Kawamata | B65D 79/0087 220/721 |
| 5,392,197 A | | 2/1995 | Cuntz et al. | |
| 5,542,453 A | * | 8/1996 | Gabas | B60T 11/26 220/721 |
| 5,968,459 A | * | 10/1999 | Nalepa | A61L 2/07 206/439 |
| 9,611,069 B2 | * | 4/2017 | Rhue | B65D 3/22 |
| 9,832,567 B2 | | 11/2017 | Zhang et al. | |
| 10,464,000 B2 | * | 11/2019 | Pourdeyhimi | B01D 39/1623 |
| 2017/0041706 A1 | | 2/2017 | Evans et al. | |
| 2017/0181303 A1 | | 6/2017 | Li et al. | |

FOREIGN PATENT DOCUMENTS

| | | |
|---|---|---|
| DE | 19946825 | 2/2001 |
| WO | 2019089021 | 5/2019 |

OTHER PUBLICATIONS

A micro-machined piezoelectric flexural-mode hydrophone with air backing: A hydrostatic pressure-balancing mechanism for integrity preservation. Sungjoon Choi, Haksue Lee and Wonkyu Moon. revised May 31, 2009; accepted Jun. 3, 2010).

* cited by examiner

*Primary Examiner* — J. Gregory Pickett
*Assistant Examiner* — Niki M Eloshway

(57) ABSTRACT

An assembly includes a housing which includes a plurality of walls defining an interior space. An electronic device is located within the interior space. At least one passage extends through a first wall of the plurality of walls. A membrane is located on an interior side of the first wall and fluidly separates the at least one passage from the interior space of the housing.

20 Claims, 3 Drawing Sheets

HOUSING WITH PRESSURE EQUALIZATION

BACKGROUND

The present disclosure relates to an electronic device and housing assembly and more particularly to equalizing pressure within the housing assembly.

The use of electronic devices throughout a vehicle is becoming increasingly common. In some instances, the electronic device is located in a housing to protect the electronic device from water or debris that may damage the electronic device or hinder the electronic device's ability to function properly. However, over the life of the housing, it is possible that water and debris may eventually find a path into an interior space of the housing.

SUMMARY

In one exemplary embodiment, an assembly includes a housing which includes a plurality of walls defining an interior space. An electronic device is located within the interior space. At least one passage extends through a first wall of the plurality of walls. A membrane is located on an interior side of the first wall and fluidly separates the at least one passage from the interior space of the housing.

In a further embodiment of any of the above, the first wall includes a protrusion and the at least one passage extends through the protrusion.

In a further embodiment of any of the above, the protrusion extends outward from the first wall away from the interior space.

In a further embodiment of any of the above, the protrusion in dome shaped.

In a further embodiment of any of the above, an exterior surface of the protrusion is covered with a filter that encloses an inlet to the at least one passage.

In a further embodiment of any of the above, the membrane is made of an elastomeric material.

In a further embodiment of any of the above, the membrane includes an inner surface that faces the interior space and an outer surface adjacent an interior surface of the first wall.

In a further embodiment of any of the above, the membrane is secured to the inner surface of the first wall adjacent a perimeter of the membrane.

In a further embodiment of any of the above, the perimeter of the membrane is attached to the inner surface of the first wall with an adhesive.

In a further embodiment of any of the above, the membrane includes at least one of a mounting protrusion or a mounting recess. The inner surface of the first wall includes the other of a mounting protrusion or a mounting recess.

In a further embodiment of any of the above, the membrane includes a projection along the perimeter of the membrane that is accepting within a receptacle on a mounting ring attached to the housing.

In a further embodiment of any of the above, the mounting ring is attached to the inner surface of the first wall with an adhesive.

In a further embodiment of any of the above, the mounting ring includes at least one of a projection or a recess that engages the other of the projection or the recess on the inner surface of the first wall.

In a further embodiment of any of the above, the membrane is disk shaped and planar between the perimeter when in an un-deformed state.

In a further embodiment of any of the above, the membrane includes at least one undulation spaced inward from the perimeter.

In a further embodiment of any of the above, the housing includes at least one joint between the plurality of walls and sealed by at least one of an adhesive or a welded interface.

In another exemplary embodiment, a method of equalizing a pressure within a housing includes deflecting a membrane at least partially defining an interior space of a housing in response to a change in pressure of the interior space. The membrane is deflected inward when the pressure of the interior space decreases. The membrane is deflected outward when the pressure of the interior space increases.

In a further embodiment of any of the above, when the membrane is deflected outward, the membrane extends into an equalization space at least partially defined by a protrusion on the housing and the membrane.

In a further embodiment of any of the above, the membrane includes at least one undulation.

In a further embodiment of any of the above, the housing includes a plurality of walls that define the interior space. An electronic device is located within the interior space. At least one passage extends through a first wall of the plurality of walls. The membrane is located on an interior side of the first wall and fluidly separates the at least one passage from the interior space. The first wall includes a protrusion and the at least one passage extends through the protrusion.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Electronic devices can be delicate and sensitive to contamination from foreign material, such as water or debris. In many applications, such as in vehicles, the electronic devices are located in a housing to protect the electronic device from contamination. However, in order for the electronic device to be placed in the housing, the housing is generally made of multiple pieces that are connected together along at least one joint. During use of the electronic device, the interior of the housing may be subject to variations in pressure relative to a surrounding environment as the result of heat generated by the electronic device or temperature variations with the surrounding environment. The variations in pressure can lead to water or debris entering a void in the joint or the formation of a void in the joint over a period of cyclic loading resulting from the variations in interior pressure of the housing. As will be discussed below, one feature of the subject disclosure is a reduction in pressure deviations for an interior space of the housing which can reduce the intrusion of contamination into the housing.

Figure 1:
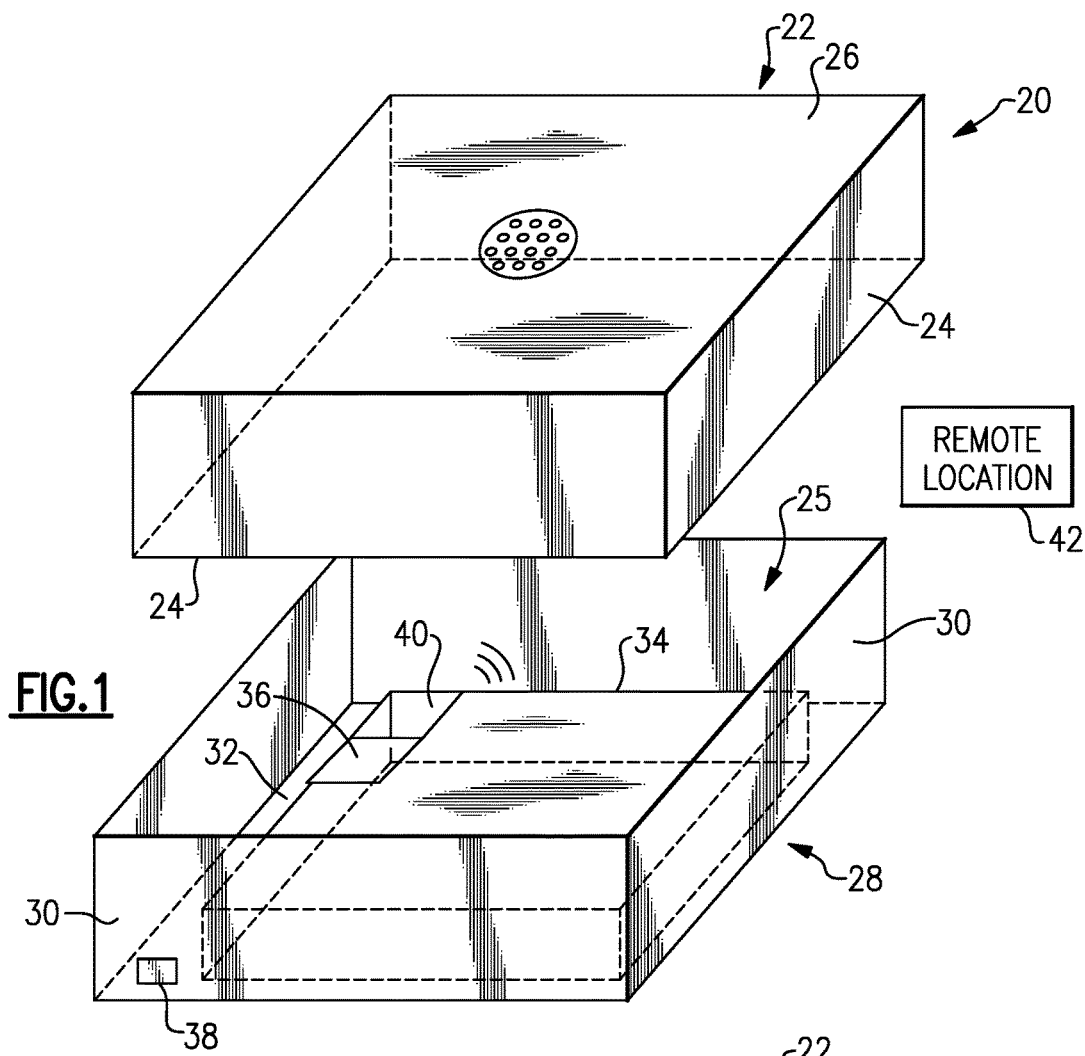
FIG. 1 illustrates an example housing in an exploded view.
Figure 2:
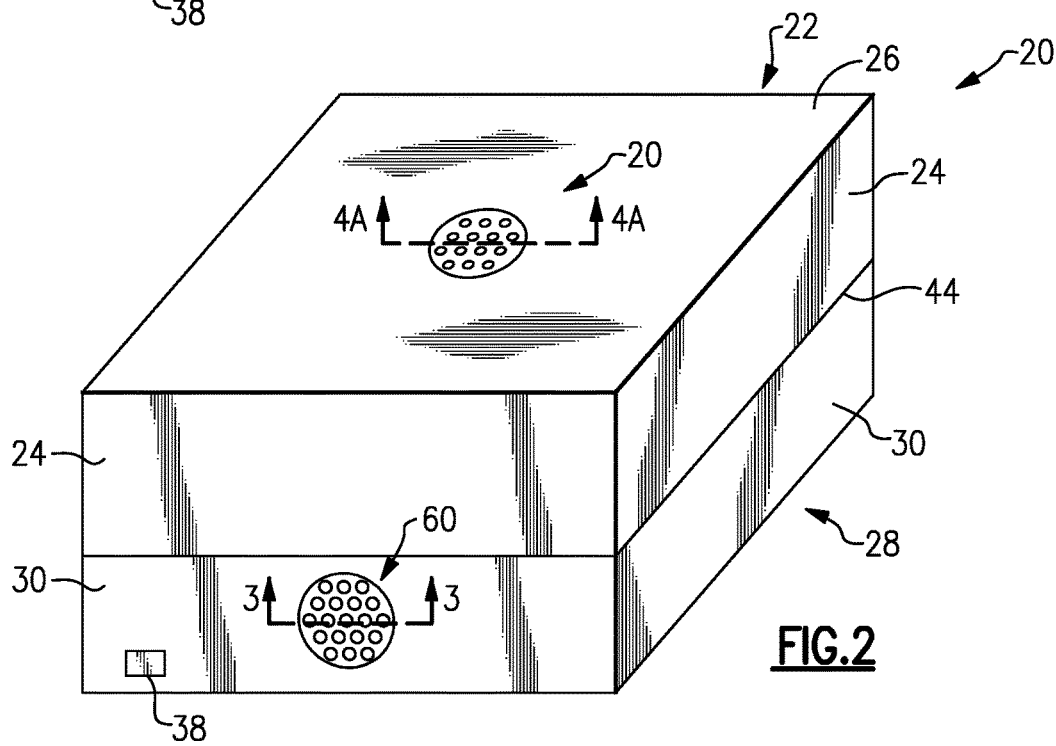
FIG. 2 illustrates a perspective view of the housing of FIG. 1 assembled.

FIGS. 1 and 2 illustrates an example electronic device housing assembly 20. The electronic device housing assembly 20 includes a first portion 22 having a plurality of sidewalls 24 and a top wall 26 and a second portion 28 having a plurality of sidewalls 30 and a bottom wall 32. In the illustrated example, an electronic device 34, such as a sensor, is located adjacent the bottom wall 32 of the second portion 28 in an interior space 25 defined by the first and second portions 22, 28. The electronic device 34 could perform a number of functions for a vehicle. The electronic device 34 may have its own power source 36 or include a connection port 38 that can transmit power to the electronic device 34. The connection port 38 can also transmit electronic device information to a remote location. Alternatively, the electronic device 34 could include a transmitter/receiver 40 for communicating with the remote location 42, such as a central controller on a vehicle.

The first and second portions 22, 28 of the housing assembly 20 each define a perimeter edge that come together to form a joint 44 for the housing assembly 20. The joint 44 may be formed by laser welding, a compressed rubberized or silicone member, vibration welding, an adhesive, or another similar method of joining two structures. The joint 44 is intended to form a water tight and air tight seal between the interior space 24 and the surrounding environment. This protects the electronic device 34 from intrusion of contaminates that might interfere with the operation of the electronic device 34.

Because the electronic device 34 and associated electronics located in the housing assembly 20 are prone to variations in temperature during operation, a temperature of the interior space 25 of the housing assembly 20 may vary with different operating conditions of the electronic device 34. Additionally, the environment where the electronic device 34 is used, such as in warm and dry climates or cold and wet climates, can further vary a temperature of the interior space 25. The variations in temperature of the interior space 25 can lead to changes in a pressure of the interior space 25 relative to the surrounding environment.

Because the interior space 25 is a sealed box that does not allow for the intrusion of contaminants, there is no way for the pressure within the interior space 25 to equalize with the surrounding environment. This places increased stress on the joint 44 between the first portion 22 and the second portion 28. In particular, the joint 44 is subjected to cyclic loading that may weaken the joint 44 over time and form a small void to the interior space 25 of the housing assembly 20. The formation of the small void can also lead to a path of intrusion for water or debris. This is particularly true for when the electronic device 34 is located on a portion of a vehicle that is regularly subject to water or dust.

In order to improve pressure equalization without allowing for intrusion of contaminants, the housing assembly 20 includes at least one pressure equalization assembly 60. In the illustrated example, one of the pressure equalization assemblies 60 is located in the top wall 26 of the first portion 22 and another of the pressure equalization assemblies 60 is located in one of the sidewalls 30 of the second portion 28. However, the housing assembly 20 could include more than one pressure equalization assembly 60 on any one of the top, bottom or sidewalls, 26, 32, 24, and 30.

Figure 3:
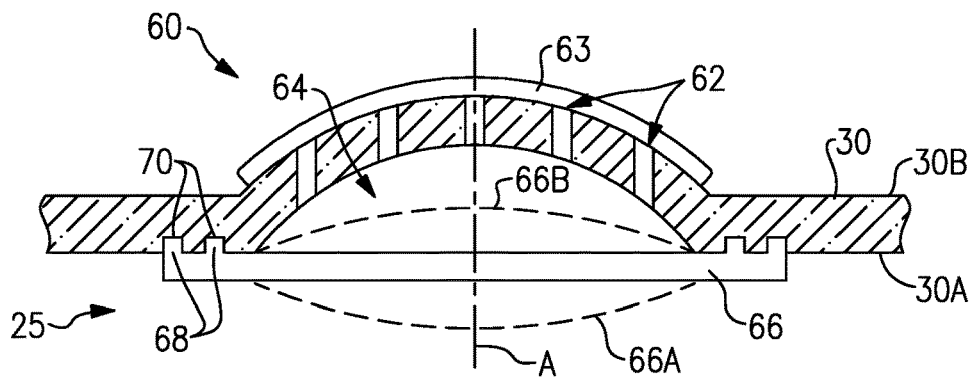
FIG. 3 is a cross-sectional view taken along line 3-3 of FIG. 2.

FIG. 3 illustrates a cross-sectional view through the equalization assembly 60 in the sidewall 30 of the second portion 28. The equalization assembly 60 includes a plurality of openings 62 that extend between a first surface 30A and a second surface 30B of the sidewall 30. In the illustrated example, the first surface 30A is one of an interior surface or exterior surface and the second surface 30B is the other of the interior surface or exterior surface. The sidewall 30 in the area of the equalization assembly 60 is also non-planar with a surrounding portion of the sidewall 30 such that the sidewall 30 at the plurality of openings 62 forms a protrusion that extends outward from the sidewall 30. The protrusion creates an equalization space 64 between the protrusion on the sidewall 30 and a membrane 66 attached to the first surface 30A of the sidewall 30. In the illustrated example, the protrusion is dome shaped. However, the protrusion could have other shapes. Additionally, the membrane 66 is circular in the illustrated example, but could have another shape, such as elliptical, rectangular, square, triangular, or another shape depending on the specific application.

When located on an interior side, the membrane 66 fluidly isolates the equalization space 64 from the interior space 25 of the housing assembly 20. In the illustrated example, the membrane 66 includes at least one protrusion 68 that is accepted within a corresponding recess 70 in the sidewall 30. The at least one protrusion 68 and the corresponding recess 70 also function to locate the membrane 66 relative to the sidewall 30 during installation of the membrane 66 on the sidewall 30. Alternatively, the at least one protrusion 68 could be located on the sidewall 30 and the recess 70 could be located in the membrane 66. Furthermore, the at least one protrusion 68 and corresponding recess 70 could be eliminated from the membrane 66 and sidewall 30, respectively. In either situation, the membrane 66 could be attached to the sidewall 30 through the use of an adhesive, vibration welding, or an overmolding process.

The membrane 66 is made of an elastomeric material such that the membrane 66 can flex inward toward the interior space 25 as shown by dashed line 66A or outward toward the sidewall 30 as shown by dashed line 66B. In the illustrated example, the membrane 66 flexes along a longitudinal axis A through a center the membrane 66 and perpendicular to the sidewall 30. The membrane 66 can flex inward when a pressure in the interior space 25 is less than a pressure in the equalization space 64 and environment surrounding the housing assembly 20. Conversely, the membrane 66 can flex outward when the pressure in the interior space 25 is greater than the pressure in the equalization space 64 and the environment surrounding the housing assembly 20.

The ability of the membrane 66 to flex inward or outward in response to pressure variations reduces a pressure differential between in the interior space 25 and the surrounding environment. One feature of the reduction in pressure differential between the interior space 25 and the surrounding environment is a reduction in stress on the joint 44, which could lead to contaminants entering the interior space 25. Contaminants in the interior space 25 can lead the electronic device 34 to have a reduced service interval.

Figure 4A:
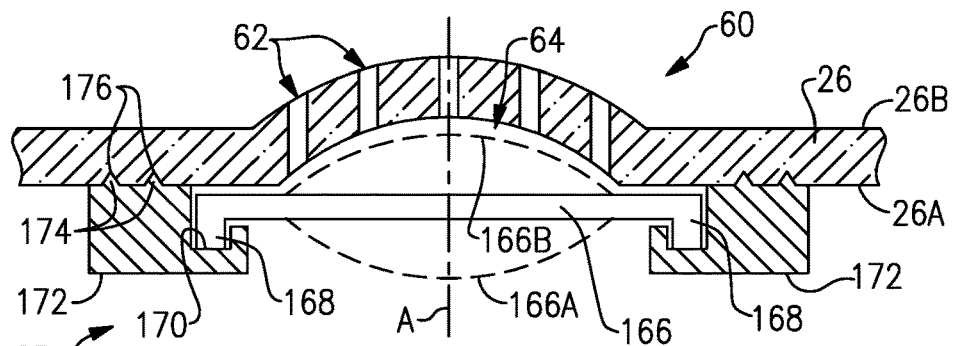
FIG. 4A is a cross-sectional view taken along line 4A-4A of FIG. 2.

FIG. 4 illustrates a cross-sectional view of the equalization assembly 60 in the top wall 26 of the first portion 22. The equalization assembly 60 in the top wall 26 is similar to the equalization assembly 60 in the sidewall 30 (FIG. 3) except where described below or shown in the Figures.

The equalization assembly 60 includes the plurality of openings 62 that extend between a first surface 26A and a second surface 26B of the top wall 26. The first surface 26A is one of an interior surface or exterior surface and the second surface 26B is the other of the interior surface or exterior surface. The plurality of openings 62 may be covered by a filter 63 to prevent debris from entering the plurality of openings 62. The top wall 26 in the area of the equalization assembly 60 is also non-planar with a surrounding portion of the top wall 26 such that the top wall 26 at the plurality of openings 62 forms a protrusion outward from the top wall 26. The protrusion outward of the top wall 26 creates the equalization space 64 between the top wall 26 and a membrane 166 attached to the first surface 26A of the top wall 26.

When located on an interior side, the membrane 166 fluidly isolates the equalization space 64 from the interior space 25 of the housing assembly 20. In the illustrated example, the membrane 166 includes a protrusion 168 that extends away from the first surface 26A, such that the membrane 166 is planar facing the first surface 26A of the top wall 26. The membrane 166 is attached to the first surface 26A with a ring 172 that includes a recess 170 that corresponds to the protrusion 168 on the membrane 166. In the illustrated example shown in FIGS. 4A and 4B, the ring 172 forms a complete loop and the recess 170 in the ring 172 is located adjacent a radially inner edge of the ring 172. In this disclosure, radial or radially is in relation to the longitudinal axis A extending through a center of the membrane 166 and perpendicular to the top wall 26 unless stated otherwise.

Figure 4B:
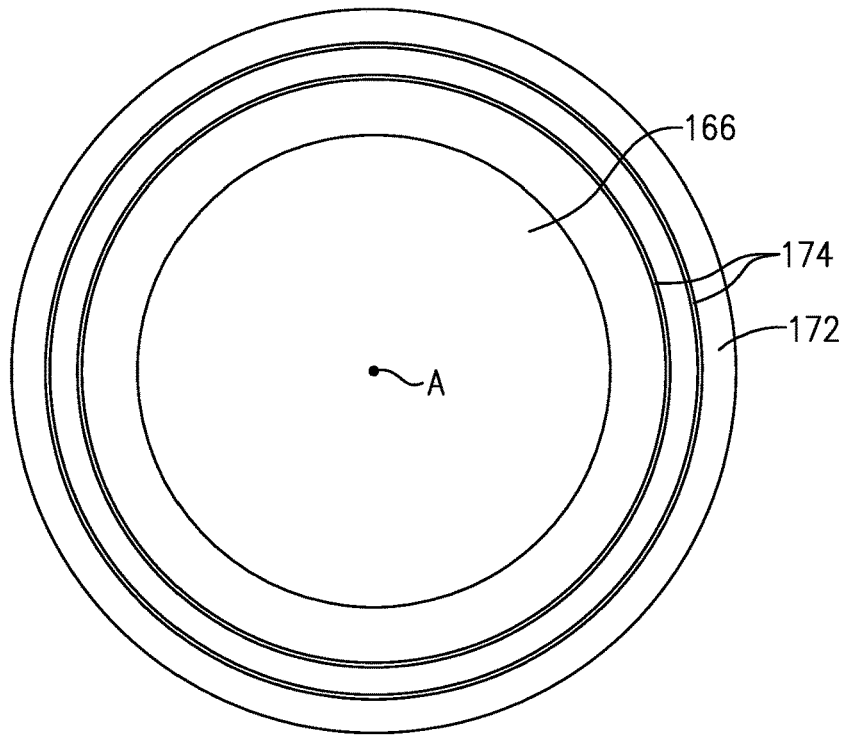
FIG. 4B is a top view of a membrane and a ring shown in FIG. 4A.

The ring 172 includes at least one protrusion 174 that is accepted into a corresponding recess 176 in the top wall 26. As shown in FIG. 4B, the at least one protrusion 174 form a complete loop around the ring 172. The at least one protrusion 174 and the corresponding recess 176 also function to locate the ring 172 relative to the top wall 26 during installation of the ring 172 on the top wall 26. Alternatively, the at least one protrusion 174 is located on the top wall 26 and the recess 176 is located in the ring 172. Furthermore, the at least one protrusion 174 and corresponding recess 176 could be eliminated from the ring 172 and top wall 26, respectively. The ring 172 could be attached to the top wall 26 through the use of an adhesive, vibration welding, or an overmolding process.

Similar to the membrane 66, the membrane 166 is made of an elastomeric material such that the membrane 166 can flex inward toward the interior space 25 as shown by dashed line 166A or outward toward the top wall 26 as shown by dashed line 166B.

Figure 5A:
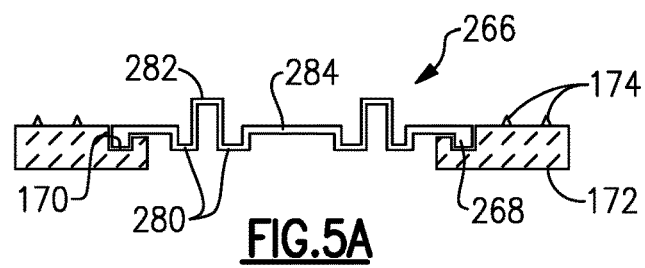
FIG. 5A is a cross-sectional view of the ring of FIG. 4A with another example membrane.
Figure 5B:
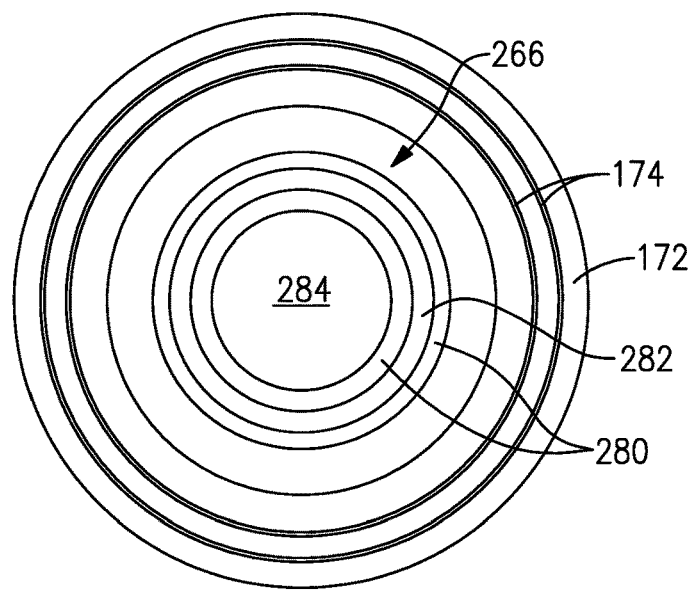
FIG. 5B is a top view of the ring and membrane of FIG. 5A.

FIGS. 5A and 5B illustrate another example membrane 266 used in connection with the ring 172 described above. The membrane 266 is similar to the membranes 66, 166 except where described below or shown in the Figures.

The membrane 266 includes a protrusion 268 that is accepted within the recess 170 on the ring 172. The membrane 266 includes at least one inwardly projecting undulations 280 and at least one outwardly projecting undulation 282 that surrounds a central disk portion 284. As shown in FIG. 5B, each of the inwardly and outwardly projecting undulations 280, 282 form a complete loop. The combination of inwardly projecting undulations 280 and outwardly projecting undulation 282 provide a greater volume change of the interior space 25 without additional stretching or flexing that occurs with the membranes 66, 166.

Figure 6:
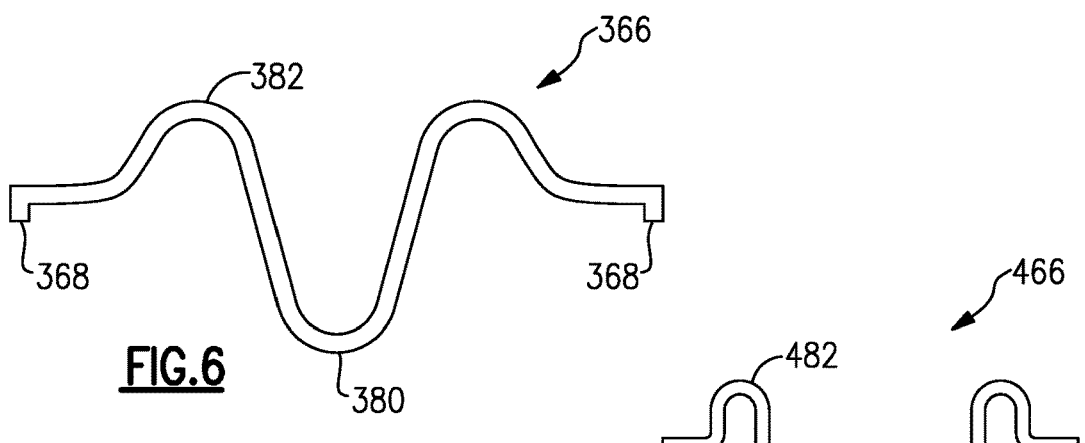
FIG. 6 illustrates yet another example membrane.

FIG. 6 illustrates yet another example membrane 366 used in connection with the ring 172 described above. The membrane 366 is similar to the membranes 66, 166, 266 except where described below or shown in the Figures.

The membrane 366 includes a protrusion 368 that is accepted within the recess 170 on the ring 172. The membrane 366 includes at least one central inwardly extending projection 380 and at least one outwardly extending undulation 382 that surrounds and forms a complete loop around the at least one central inwardly extending projection 380. The combination of the central inwardly extending projection 380 and the outwardly extending undulation 382 can provide for a greater volume change of the interior space 25 without additional stretching or flexing that occurs with the membranes 66, 166.

Figure 7:
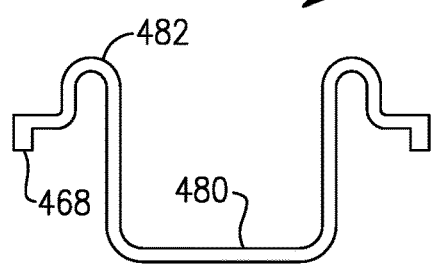
FIG. 7 illustrates a further example membrane.

FIG. 7 illustrates a further example membrane 466 used in connection with the ring 172 described above. The membrane 466 is similar to the membranes 66, 166, 266, 366 except where described below or shown in the Figures.

The membrane 466 includes a protrusion 468 that is accepted within the recess 170 on the ring 172. The membrane 466 includes at least one central inwardly extending disk 480 and at least one outwardly extending undulation 482 that surrounds and forms a complete loop around the at least one central inwardly extending disk 480. The combination of the central inwardly extending disk 480 and the outwardly extending undulation 482 can provide for a greater volume change of the interior space 25 without additional stretching or flexing that occurs with the membranes 66, 166.

Although the different non-limiting examples are illustrated as having specific components, the examples of this disclosure are not limited to those particular combinations. It is possible to use some of the components or features from any of the non-limiting examples in combination with features or components from any of the other non-limiting examples.

It should be understood that like reference numerals identify corresponding or similar elements throughout the several drawings. It should also be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claim should be studied to determine the true scope and content of this disclosure.

What is claimed is:

1. An assembly comprising:
    a housing including a plurality of walls defining an interior space;
    an electronic device located within the interior space;
    at least one passage extending through a first wall of the plurality of walls;
    a membrane located on a first side of the first wall and fluidly separating the at least one passage from the interior space of the housing;
    wherein the membrane includes an inner surface that faces the interior space and an outer surface adjacent the first side of the first wall;
    wherein the membrane is secured to the inner surface of the first wall adjacent a perimeter of the membrane; and
    wherein the membrane includes at least one of a mounting protrusion or a mounting recess and the inner surface of the first wall includes the other of the mounting protrusion or the mounting recess.

2. The assembly of claim 1, wherein the first wall includes a protrusion and the at least one passage extends through the protrusion.

3. The assembly of claim 2, wherein the protrusion extends outward from the first wall away from the interior space.

4. The assembly of claim 2, wherein the protrusion in dome shaped.

5. The assembly of claim 2, wherein an exterior surface of the protrusion is covered with a filter that encloses an inlet to the at least one passage.

6. The assembly of claim 1, wherein the membrane is made of an elastomeric material.

7. The assembly of claim 1, wherein the perimeter of the membrane is attached to the inner surface of the first wall with an adhesive.

8. The assembly of claim 1, wherein the membrane includes a projection along the perimeter of the membrane that is accepting within a recess on a mounting ring attached to the housing.

9. The assembly of claim 8, wherein the mounting ring is attached to the inner surface of the first wall with an adhesive.

10. The assembly of claim 8, wherein the mounting ring includes at least one of a projection or a recess that engages the other of the projection or the recess on the inner surface of the first wall.

11. The assembly of claim 1, wherein the membrane is disk shaped and planar between the perimeter when in an un-deformed state.

12. The assembly of claim 1, wherein the membrane includes at least one undulation spaced inward from the perimeter.

13. The assembly of claim 1, wherein the housing includes at least one joint between the plurality of walls and sealed by at least one of an adhesive or a welded interface.

14. A method of equalizing a pressure within a housing comprising:
   securing a membrane to an inner surface of a first wall of the housing to at least partially defining an interior space of the housing, wherein the membrane includes at least one of a mounting protrusion or a mounting recess and the inner surface of the first wall includes the other of the mounting protrusion or the mounting recess;
   deflecting a membrane in response to a change in pressure of the interior space, wherein the membrane is deflected inward when the pressure of the interior space decreases and the membrane is deflected outward when the pressure of the interior space increases.

15. The method of claim 14, wherein when the membrane is deflected outward, the membrane extends into an equalization space at least partially defined by a protrusion on the housing and the membrane.

16. The method of claim 15, wherein the membrane includes at least one undulation.

17. The method of claim 15, wherein the housing includes:
   a plurality of walls defining the interior space;
   an electronic device located within the interior space; and
   at least one passage extending through the first wall of the plurality of walls, wherein the membrane is located on a first side of the first wall and fluidly separates an exterior space from the interior space and wherein the first wall includes a protrusion and the at least one passage extends through the protrusion.

18. An assembly comprising:
   a housing including a plurality of walls defining an interior space;
   an electronic device located within the interior space;
   at least one passage extending through a first wall of the plurality of walls;
   a membrane located on a first side of the first wall and fluidly separating the at least one passage from the interior space of the housing;
   wherein the membrane includes an inner surface that faces the interior space and an outer surface adjacent the first side of the first wall;
   wherein the membrane is secured to the inner surface of the first wall adjacent a perimeter of the membrane; and
   wherein the membrane includes a projection along the perimeter of the membrane that is accepting within a recess on a mounting ring attached to the housing.

19. The assembly of claim 18, wherein the mounting ring is attached to the inner surface of the first wall with an adhesive.

20. The assembly of claim 18, wherein the mounting ring includes at least one of a projection or a recess that engages the other of the projection or the recess on the inner surface of the first wall.

* * * * *